United States Patent [19]

Imai et al.

[11] Patent Number: 4,985,224
[45] Date of Patent: Jan. 15, 1991

[54] PROCESS FOR MAKING SILICON NITRIDE WHISKER

[75] Inventors: Isao Imai, Nagoya; Toshitsugu Ishii, Chita; Kouichi Sueyoshi, Kariya, all of Japan

[73] Assignee: Toshiba Ceramics Co., Ltd., Japan

[21] Appl. No.: 420,033

[22] Filed: Oct. 11, 1989

[51] Int. Cl.$^5$ .......................................... C01B 21/068
[52] U.S. Cl. ..................................................... 423/344
[58] Field of Search ......................................... 423/344

[56] References Cited

U.S. PATENT DOCUMENTS

| | | | |
|---|---|---|---|
| 3,991,166 | 11/1976 | Jack et al. | 423/327 |
| 4,280,989 | 7/1981 | Seimiya et al. | 423/344 |
| 4,414,190 | 11/1983 | Seimiya et al. | 423/344 |
| 4,594,330 | 6/1986 | Suzuki et al. | 423/344 |
| 4,604,273 | 8/1986 | Czupryna et al. | 423/344 |

FOREIGN PATENT DOCUMENTS 0175712 10/1982 Japan ................................. 423/344

Primary Examiner—Gary P. Straub
Assistant Examiner—Lori F. Cuomo
Attorney, Agent, or Firm—Lorusso & Loud

[57] ABSTRACT

Silica powder or a mixture of silica powder and silicon nitride whisker is heated at a temperature ranging from 800° C. to 1,700° C. in a gas mixture of ammonia gas ($NH_3$) and hydrocarbon gas ($C_mH_n$) so as to produce silicon nitride whisker. The gas mixture flows at the rate of 10 mm/sec or less. The $NH_3/CH_4$ ratio of the ammonia to the hydrocarbon, expressed as $CH_4$, ranges from 0.5:1 to 2000:1 by volume. The silica powder is preferably mixed with at least one of six catalysts: transition metals; alkali metals; alkaline earth metals; halides of transition metals; halides of alkali metals; and alkaline earth metals. One mol part of the silica powder is mixed with 0.001–1.0 mol part of the catalyst.

20 Claims, No Drawings

PROCESS FOR MAKING SILICON NITRIDE WHISKER

BACKGROUND OF THE INVENTION

1. Field of the Invention

The present invention relates to a process for making silicon nitride whiskers.

2. Description of Related Art

Japanese Patent No. 838,421 discloses a method for making silicon nitride whiskers by mixing amorphous silica powders, to which fluoride, acidic fluoride or silica-fluoride are attached, with carbonaceous powders so as to produce a mixture and heating the mixture in a nitrogen atmosphere at a temperature of 1,300° C. to 1,600° C.

In the conventional process for preparing silicon nitride whiskers, silica powders are mixed with the carbon powders in a solid-solid reaction manner. If they are not properly mixed, no uniform reaction takes place. As a result, diameters of the produced whiskers vary. Even silicon powders are sometimes are produced in admixture with the whiskers.

SUMMARY OF THE INVENTION

The object of the present invention is to provide a process for making silicon nitride whiskers having substantially uniform diameters with a good yield, excluding any silicon nitride powders.

According to this invention, a powder of silica or a silica precursor is heated at a temperature ranging from 800° C. to 1,700° C. and preferably from 1,200° C. to 1,700° C. in a gas mixture of ammonia gas ($NH_3$) and hydrocarbon gas ($C_mH_n$) so as to produce silicon nitride whiskers. Examples of the hydrocarbon gas are methane, ethane, propane and acetylene gases. The bulk specific gravity of the silica powders is preferably 400 g/l or less and ranges from 50 g/l to 200 g/l for the best results.

The gas mixture flows at a flow rate of 10 mm/sec or less and preferably ranging from 10 mm/sec to 0.1 mm/sec. For the best results, the flow rate ranges from 5 mm/sec to 0.1 mm/sec. If the flow rate is larger than 10 mm/sec, silicon nitride powders could be partly produced in admixture with silicon nitride whiskers.

The $NH_3/CH_4$ ratio of the ammonia to the hydrocarbon, expressed as $CH_4$, ranges from 0.5:1 to 2000:1 by volume and preferably from 20:1 to 1000:1 by volume or from 0.1/100 to 5/100. If the ratio ($NH_3/CmHn$) is lesser than 0.5:1 by volume, the partial pressure of $NH_3$ becomes too low, causing the reaction to proceed too slowly. If the ratio is larger than 2,000:1 by volume, the effect of addition of $CH_4$ cannot be obtained.

The silica powders are preferably mixed with at least one of six catalysts: transition metals; alkali metals; alkaline earth metals; halides of transition metals; halides of alkali metals; and alkaline earth metals. All six catalysts can be used in combination. One mol part of the silica powders is preferably mixed with 0.001–1.0 mol part of the catalyst. In such a case, silicon nitride whiskers can be stable and quickly produced.

Basically, silicon nitride whiskers are produced according to the following reaction scheme (1):

$$3SiO_2 + 4NH_3 = Si_3N_4 + 6H_2O \quad (1)$$

The partial pressure of $H_2O$ generated during the reaction is reduced in accordance with the following reaction (2):

$$mH_2O + CmHn = mCO + (m+n/2)H_2 \quad (2)$$

Reduction in the partial pressure of $H_2O$ in accordance with the reaction scheme (2) may smoothly proceed in accordance with the reaction scheme (1).

The reaction is carried out at a temperature in the range from 800° C. to 1,700° C. and preferably 1,200° C. to 1,700° C. If the temperature is lower than 800° C., on the one hand, the reaction does not substantially proceed in a desired manner. If the temperature is higher than 1,700° C., on the other hand, SiC is partially produced so that the purity of the produced silicon nitride whiskers decreases.

In order to accelerate production of silicon nitride whiskers, a mullite or kaolinite substance such as $SiO_2$, $Al_2O_3$ or a compound thereof can be admixed into the reaction mixture.

The present invention will be further described below by way of examples. In place of silica powder ($SiO_2$) only, a mixture of silica powder and silicon nitride whisker ($Si_3N_4$) can be used as a starting material. If 10% or more of silicon nitride whisker is mixed with 90% or less of silica powder, the diameter of the produced silicon nitride whisker becomes large.

EXAMPLE 1

3 grams of silica powders having an average diameter of 0.02 microns was set in a boat made of silicon nitride. The boat was inserted into an alumina process tube. A gas mixture of ammonia gas ($NH_3$) and hydrocarbon gas ($C_3H_8$) was introduced at the flow rate of 1 mm/sec under standard conditions, causing a turbulence of the mixed gas in the process tube, while the silica powders were heated at 1,400° C. for 4 hours.

The resulting product was analyzed to determine its structure by a well-known X-ray analysis and SEM. Table 1B below shows the results of analysis.

EXAMPLES 2–6

In Example 2, 0.05 mol part of NaCl was added to one mol part of the silica powders (3 grams) having an average diameter of 0.02 microns so as to make a first mixture. Acetone was added to the first mixture and then blended in an agate mortar so as to make a second mixture. After the second mixture was dried, the procedures followed substantially the same procedure as in Example 1 with the exception that the heating temperature was 1,450° C.

In Example 3, 0.5 mol part of NaF was added to 1 mol part of silica so as to make a mixture. After that, the procedures followed substantially the same procedure as in Example 1.

In Examples 4 to 6, the procedures followed substantially the same procedure as in Example 1 with the exceptions shown in Table 1A.

COMPARATIVE EXAMPLES 1–4

The procedures followed substantially the same procedure as Example 1 with the exceptions shown in Table 1A. The results of the analyses are shown in Table 1B below.

TABLE 1A

| | Process Conditions | | | | | |
|---|---|---|---|---|---|---|
| | Added Material | Mixture Ratio | Type of mixed gas | Gas Flow Rate (mm/sec) | Heating Temperature (°C.) | Heating Time (hr) |
| Example | | | | | | |
| 1 | — | — | C$_3$H$_8$ + NH$_3$ | 1 | 1400 | 4 |
| 2 | NaCl | 0.05 | | 5 | 1450 | 4 |
| 3 | NaF | 0.5 | | 5 | 1400 | 4 |
| 4 | Fe | 0.001 | | 5 | 1400 | 4 |
| 5 | MgCl$_2$ | 0.005 | | 5 | 1400 | 4 |
| 6 | FeCl$_3$ | 0.003 | | 5 | 1350 | 4 |
| Comparative Example | | | | | | |
| 1 | — | — | C$_3$H$_8$ + NH$_3$ | 15 | 1450 | 4 |
| 2 | NaCl | 2 | | 5 | 1450 | 4 |
| 3 | NaCl | 0.05 | | 5 | 1700 | 4 |
| 4 | NaCl | 0.05 | | 5 | 750 | 4 |

*The mixture ratio denotes the ratio of the mol part of the added material to 1 mol part of silica (SiO$_2$).
*The NH$_3$/C$_3$H$_8$ ratio is 1.32/100 by volume.

TABLE 1B

| | | Characteristics of the Product | | |
|---|---|---|---|---|
| | | X-ray analysis Indentification Phase | SEM observation (micron meters) | |
| | | | Length | Diameter |
| Example | 1 | alpha-Si$_3$N$_4$ | 20–50 | 0.5–1.0 |
| Example | 2 | " | 20–50 | 0.5–1.0 |
| Example | 3 | " | 20–50 | 0.5–1.0 |
| Example | 4 | " | 20–50 | 0.5–1.5 |
| Example | 5 | " | 20–50 | 0.5–1.0 |
| Example | 6 | " | 10–50 | 0.1–1.0 |
| Comparative Example | 1 | alpha-Si$_3$N$_4$ | No whiskers are produced. | |
| | 2 | Amorp. SiO$_2$ >> alpha-Si$_3$N$_4$ | Many glass balls are produced. | |
| | 3 | SiC >> alpha-Si$_3$N$_4$ | 5–50 | 0.1–1.5 |
| | 4 | Amorph. SiO$_2$ | No reaction proceeds. | |

As will be apparent from Tables 1A and 1B above, it has been found that the produced silicon nitride whiskers have uniform length and diameters with an excellent yield, for example, such as 75–80 % in Examples 1 to 6 embodying the present invention.

What is claimed is:

1. A process for producing silicon nitride whiskers, said process comprising:
providing a powder consisting essentially of silica;
contacting said powder with a gas mixture consisting essentially of ammonia and hydrocarbon gas, the NH$_3$/CH$_4$ ratio of said ammonia to said hydrocarbon, expressed as CH$_4$, ranging from 0.5:1 to 2000:1 by volume; and
heating said powder in said gas mixture to a temperature of 800° C. to 1700° C. while said gas mixture is supplied at the rate of 10 mm/sec or less;
wherein the silicon nitride whiskers are produced according to the following reaction:

$$3SiO_2 + 4NH_3 = Si_3N_4 + 6H_2O$$

and the H$_2$O generated during the reaction is removed from said gas mixture in accordance with the following reaction:

$$mH_2O + CmHn = mCO + (m+n/2)H_2.$$

2. A process as claimed in claim 1, wherein said gas mixture flows at the rate of 5 to 0.1 mm/sec.

3. A process as claimed in claim 1, wherein said gas mixture flows at the rate of 10 to 0.1 mm/sec.

4. A process as claimed in claim 1, wherein the heating temperature ranges from 1200° C. to 1700° C.

5. A process as claimed in claim 1, wherein the NH$_3$/CH$_4$ ratio ranges from 20:1 to 1000:1.

6. A process as claimed in claim 1, wherein the powder is mixed with at least one catalyst selected from the group consisting of: transition metals, alkali metals, alkaline earth metals, halides of transition metals, halides of alkali metals and alkaline earth metals.

7. A process as claimed in claim 6, wherein one mol part of the powder is mixed with 0.001–1.0 mol part of the catalyst.

8. A process as claimed in claim 1, wherein the powder is set in a boat made of silicon nitride and wherein the boat is inserted in a process tube made of alumina.

9. A process as claimed in claim 6, wherein the powder and the catalyst are set in a boat made of silicon nitride and wherein the boat is inserted in a process tube made of alumina.

10. A process as claim 8, wherein the powder has an average diameter of 0.02 micron meters or less.

11. A process for producing silicon nitride whiskers, said process comprising:
providing a powder mixture of silicon nitride whiskers and a powder consisting essentially of silica;
contacting said powder mixture with a gas mixture consisting essentially of ammonia and hydrocarbon gas, the NH$_3$/CH$_4$ ratio of said ammonia to said hydrocarbon, expressed as CH$_4$, ranging from 0.5:1 to 2000:1 by volume; and
heating said powder mixture in said gas mixture to a temperature of 800° C. to 1700° C. while said gas mixture is supplied at the rate of 10 mm/sec or less;
wherein the silicon nitride whiskers are produced according to the following reaction:

$$3SiO_2 + 4NH_3 = Si_3N_4 + 6H_2O$$

and the H$_2$O generated during the reaction is removed from said gas mixture in accordance with the following reaction:

$$mH_2O + CmHn = mCO + (m+n/2)H_2.$$

12. A process as claimed in claim 11, wherein said gas mixture flows at the rate of 5 to 0.1 mm/sec.

13. A process as claimed in claim 11, wherein said gas mixture flows at the rate of 10 to 0.1 mm/sec.

14. A process as claimed in claim 11, wherein the heating temperature ranges from 1200° C. to 1700° C.

15. A process as claimed in claim 11, wherein the $NH_3/CH_4$ ratio ranges from 20:1 to 1000:1.

16. A process as claimed in claim 11, wherein said mixture is mixed with at least one catalyst selected from the group consisting of: transition metals, alkali metals, alkaline earth metals, halides of transition metals, halides of alkali metals and alkaline earth metals.

17. A process as claimed in claim 16, wherein one mol part of the powder is mixed with 0.001–1.0 mol part of the catalyst.

18. A process as claimed in claim 11, wherein the mixture is set in a boat made of silicon nitride and wherein the boat is inserted in a process tube made of alumina.

19. A process as claimed in claim 16, wherein the mixture and the catalyst are set in a boat made of silicon nitride and wherein the boat is inserted in a process tube made of alumina.

20. A process as claim 18, wherein the powder has an average diameter of 0.02 micron meters or less.

* * * * *